United States Patent
Wang et al.

(10) Patent No.: US 7,610,527 B2
(45) Date of Patent: Oct. 27, 2009

(54) TEST OUTPUT COMPACTION WITH IMPROVED BLOCKING OF UNKNOWN VALUES

(75) Inventors: Seongmoon Wang, Plainsboro, NJ (US); Kedarnath J Balakrishnan, Plainsboro, NJ (US); Srimat T Chakradhar, Manalapan, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 561 days.

(21) Appl. No.: 11/276,771

(22) Filed: Mar. 14, 2006

(65) Prior Publication Data
US 2006/0236186 A1    Oct. 19, 2006

Related U.S. Application Data

(60) Provisional application No. 60/662,239, filed on Mar. 16, 2005.

(51) Int. Cl.
*G06F 11/00* (2006.01)
*G01R 31/28* (2006.01)

(52) U.S. Cl. .................. 714/724; 714/30; 714/720; 714/728; 714/729; 714/738; 714/739

(58) Field of Classification Search .................. 714/30, 714/720, 724, 728, 729, 738, 739
See application file for complete search history.

(56) References Cited

U.S. PATENT DOCUMENTS

| | | | | |
|---|---|---|---|---|
| 6,557,129 B1 * | 4/2003 | Rajski et al. | ................. | 714/729 |
| 6,789,221 B2 * | 9/2004 | Hapke | ......................... | 714/733 |
| 7,197,721 B2 * | 3/2007 | Patil et al. | ....................... | 716/1 |
| 7,237,162 B1 * | 6/2007 | Wohl et al. | ................... | 714/726 |
| 7,376,873 B2 * | 5/2008 | Vranken et al. | ............. | 714/724 |

OTHER PUBLICATIONS

Naruse et al., On-chip Compression of Output Responses with Unknown Values Using LFSR Reseeding, 2003, IEEE, pp. 1060-1068.*
Zacharia et al., Decompression of Test Data Using Variable-Length Seed LFSRs, 1995, IEEE, pp. 426-433.*
Wang et al., X-Block: An Efficient LFSR Reseeding-Based Method to Block Unknowns for Temporal Compactors, Jul. 2008, IEEE, vol. 57, No. 7, pp. 978-989.*

* cited by examiner

*Primary Examiner*—John J Tabone, Jr.
(74) *Attorney, Agent, or Firm*—Joseph J. Kolodka

(57) ABSTRACT

Implementations of the present principles are directed to test output compaction arrangements and a methods of generating control patterns for unknown blocking. The specified bits in the control patterns, which when using linear feedback shift register (LFSR) reseeding determines control data volume and LFSR size, are preferably organized in a manner so as to balance the number of specified bits in the control patterns across test patterns.

15 Claims, 9 Drawing Sheets

(A)

(B)

(C)

TEST OUTPUT COMPACTION WITH IMPROVED BLOCKING OF UNKNOWN VALUES

CROSS-REFERENCE TO RELATED APPLICATIONS

This application claims the benefit of and is a non-provisional of U.S. Provisional Patent Application Ser. No. 60/662,239, entitled "TEST OUTPUT COMPACTION WITH IMPROVED BLOCKING OF UNKNOWN VALUES," filed on Mar. 16, 2005, the contents of which are incorporated herein by reference.

BACKGROUND OF INVENTION

The present invention is related to testing of logic circuit designs and, in particular, to compaction of test response data.

Testing of complicated digital logic circuits requires the analysis of a large amount of test response data. A variety of output compaction techniques have been devised for reducing the size of test response data stored in test memory. Techniques to reduce output responses can be classified into two basic categories: "spatial compaction" and "temporal compaction." Spatial compaction reduces response data volume by reducing the number of outputs that are observed by automatic test equipment. Temporal compaction compresses output responses over a period of time into a signature, which is typically significantly smaller than the size of even a single uncompressed output response.

The output response of scan test patterns unfortunately can contain what are referred to as "unknown" values. This can occur for several reasons: the presence of non-scan flip-flops, embedded memories, tristate buffers, the limitation in accuracy of simulation, etc. The presence of unknown values in the output response creates complications for test data reduction. Consider, for example, a simple spatial compactor built with XOR trees. If an output that has a fault effect appears along with an unknown at a given scan shift cycle, the fault effect is masked and cannot be observed at the output of the compactor during that cycle. Consider a multiple input signature register, the simplest and most popular example of a temporal compactor. The entrance of any known value corrupts the signature for output responses over the entire period of time. Thus, the presence of unknown values at outputs is catastrophic in temporal compaction. Since it is difficult and costly to eliminate all unknown sources from the design, it is preferable that the output response compaction technique take into account the presence of unknown values in scan flip-flops. For example, blocking logic (based on OR gates or AND gates) can be used to block unknown values before they enter into a temporal compactor. If an unknown value is scanned out at a shift cycle, the unknown value can be blocked by a logic gate which is driven by a control signal generator. Control data for the blocking logic, unfortunately, needs to be stored like test data, typically in the automatic test equipment. Accordingly, it would be advantageous to minimize the control data volume while avoiding any significant reduction in the observability of the compactor.

SUMMARY OF INVENTION

A test output compaction arrangement and a method of generating control patterns for unknown blocking and fault propagation is herein disclosed. The specified bits in the control patterns, which when using a technique such as linear feedback shift register (LFSR) reseeding determines control data volume and LFSR size, are preferably organized in a manner so as to balance the number of specified bits in the control patterns across test patterns. This can be accomplished by specifying the control pattern to target faults which are detected uniquely by the test pattern, which the inventors refer to as single detection faults. The number of specified bits can be further reduced by observing one fault effect for every single detection fault. In one embodiment, target fault lists are generated in a forward order, e.g., using fault simulation, in which faults detected by each test pattern are dropped from the fault list. Control patterns are then generated for each test pattern in a reverse order, and specified bits are assigned to each control pattern so as to block unknowns and to propagate at least one fault effect for each fault in the target fault lists to the temporal compactor. In another embodiment, a determination is made of the single detection faults and multiple detection faults for each test pattern. The specified bits in each control pattern are assigned so as to propagate all single detection faults. Any additional specified bits available in the control pattern can be used to propagate multiple detection faults to the temporal compactor. If the specified bits exceeds the number of stages of the LFSR, a larger LFSR may be utilized or multiple control patterns may be used with the same test pattern. LFSR seeds can be computed for the control patterns so as to minimize possible degradation on test quality due to single fault effect propagation by intelligently assigning free variables in equations to compute seeds for control patterns. The disclosed techniques are applicable to both deterministic test and built-in self-test environments.

Also disclosed herein is a technique to minimize the storage overhead for seeds for the control signal generator, such as an LFSR, by reusing seeds to generate multiple control signals for the control signal generator. Also disclosed herein is a test output compaction arrangement which utilizes spatial compactors in combination with the temporal compactor. The number of specified bits in control patterns can be further reduced if spatial compactors are used to compress output responses in conjunction with the temporal compactor.

The disclosed techniques can provide good fault coverage with a small amount of control data for the blocking logic. Moreover, the reduction in storage requirements can be achieved with very low hardware overhead and in a short run time. The disclosed techniques can achieve the same fault coverage that can be achieved by direct scan chain observation without modification of existing test patterns or addition of new test patterns. These and other advantages of the invention will be apparent to those of ordinary skill in the art by reference to the following detailed description and the accompanying drawings.

DETAILED DESCRIPTION

Figure 1:
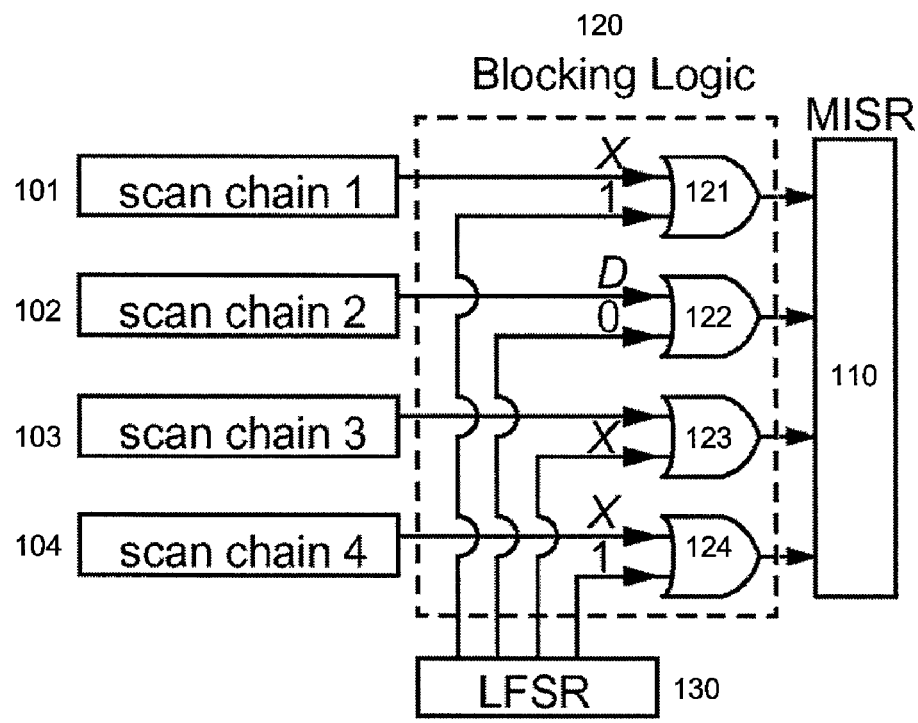
FIG. 1 is a block diagram of an output compactor with an unknown blocking arrangement using reseeding based on a linear feedback shift register, suitable for describing an embodiment of the present invention.

FIG. 1 is a block diagram of an output compactor with an unknown blocking arrangement utilizing reseeding with on a linear feedback shift register, suitable for describing an embodiment of the present invention.

The depicted circuit illustratively includes four scan chains 101, 102, 103, 104 with a temporal compactor 110, illustratively and without limitation a multiple input signature register (MISR). The circuit also includes blocking logic 120, as depicted in FIG. 1, illustratively implemented using OR gates 121, 122, 123, 124 (although it would be readily appreciated that the blocking logic could be implemented with other logic components such as AND gates). Unknowns and fault effects are blocked or propagated by control signals that are driven by the linear feedback shift register ("LFSR") 130. In order to propagate an error (fault effect) to the MISR, the control input of the corresponding blocking logic gate is set to a 0 (for example, see the fault effect labelled "D" at the output of scan chain 102 in FIG. 1). On the other hand, if an unknown appears at the output of a scan chain, then the unknown must be blocked by setting the control input of the corresponding blocking logic gate to a 1 (for example, see the two unknowns that are scanned out at the outputs of scan chain 101 and scan chain 104). All the other control inputs need not be specified. Control signals for the blocking logic gates are generated by the LFSR by loading appropriate seeds from the automatic test equipment (ATE) memory into the LFSR. In LFSR reseeding, the number of specified bits in the most specified test pattern, which is often denoted by $S_{max}$, determines the size of seeds or the number of stages of the LFSR. Hence, it is desirable to minimize the number of specified bits in the control pattern that has the most specified bits to reduce overall control data volume.

The number of bits to be specified in a control pattern will be determined by by the number of unknowns to be blocked and by the number of fault effects that are selected to propagate to the temporal compactor. The fault effect of a fault that is activated at its faulty circuit node by a test pattern often propagates through several paths and is captured into multiple scan flip-flops. A fault can be detected by observing only a single fault effect of the fault. Hence, the number of specified bits in a control pattern can be reduced by propagating only one fault effect of each fault.

Figure 2:
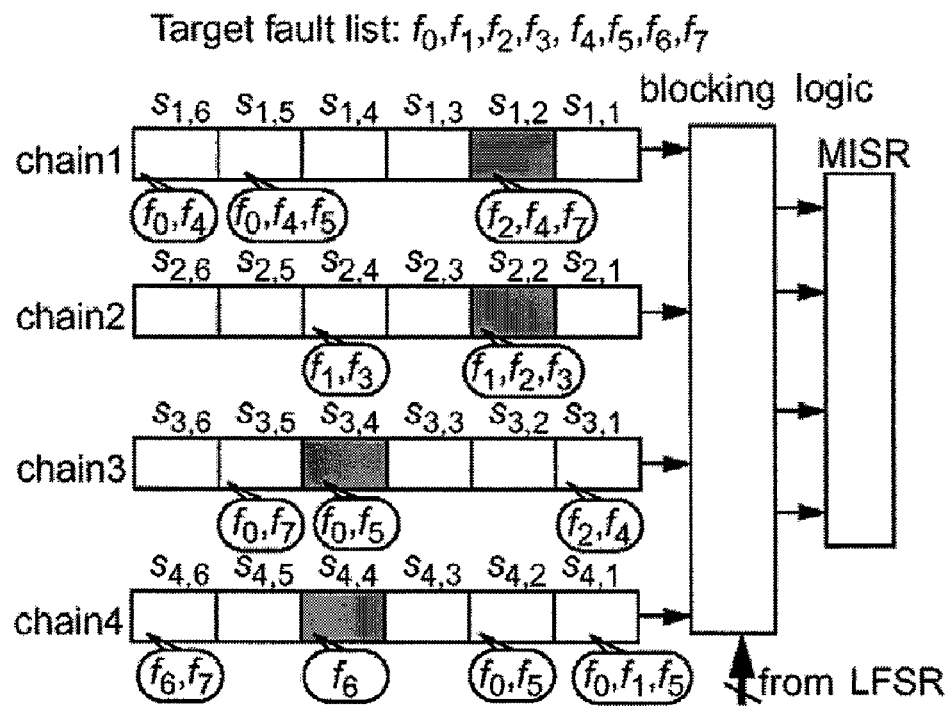
FIG. 2 illustrates how control bits can be reduced for fault effects captured in scan chains by an example test pattern.

FIG. 2 illustrates fault effects captured in scan flip-flops by test pattern $p_i$. A total of eight faults, $f_0, f_1, \ldots, f_7$, can be detected by $p_i$ if scan chains are directly observed without any compactor. For simplicity, assume that no unknowns are captured into scan flip-flops by $p_i$ (since all the bits corresponding to scan flip-flops that capture unknowns must be specified to block unknowns, we focus on minimizing only the number of control bits specified to propagate fault effects). Our objective is to detect all the 8 faults even through the blocking logic and the MISR. Since there are 12 scan flip-flops that capture at least one fault effect, 12 control bits should be specified to 0's to propagate all fault effects to the MISR. However, if we observe only the 4 highlighted scan flip-flops, $s_{1,2}, s_{2,2}, s_{3,4}$, and $s_{4,4}$, then we can detect all the 8 faults. In other words, specifying only 4 control bits to 0's is enough to detect all the 8 faults.

As noted above, LFSR seeds are stored in the ATE memory, and, in most LFSR-reseeding techniques, the size of seeds is determined by the number of specified bits in the test cube that has the most specified bits. Hence, even if there is only one control pattern where a large number of bits are specified and the other control patterns have small numbers of specified bits, it will result in very large control data. Accordingly, it is advantageous to balance numbers of specified bits in each control pattern. In balancing specified bits across test patterns, it is possible to take advantage of the fact that a typical set of test patterns detects most faults multiple times. In other words, many faults are detected by more than one test pattern in a set of test patterns. If a fault is detected by only one test pattern in the set, then the fault is referred to herein as a single detection fault. Otherwise, the fault is referred to herein as a multiple detection fault. Among multiple detection faults, faults that are detected by exactly two test patterns are referred to herein as double detection faults. Suppose that a double detection fault $f_a$ is detected by test pattern $p_i$ and $p_j$. Even if none of fault effects of fault $f_a$ are observed due to being blocked by the blocking logic when test pattern $p_i$ is applied, fault $f_a$ can still be detected if at least one fault effect of $f_a$ is observed (propagates to the temporal compactor) when the other test pattern $p_j$ is applied. It is necessary to observe only single detection faults of each test pattern in order to obtain full fault coverage.

Figure 3:
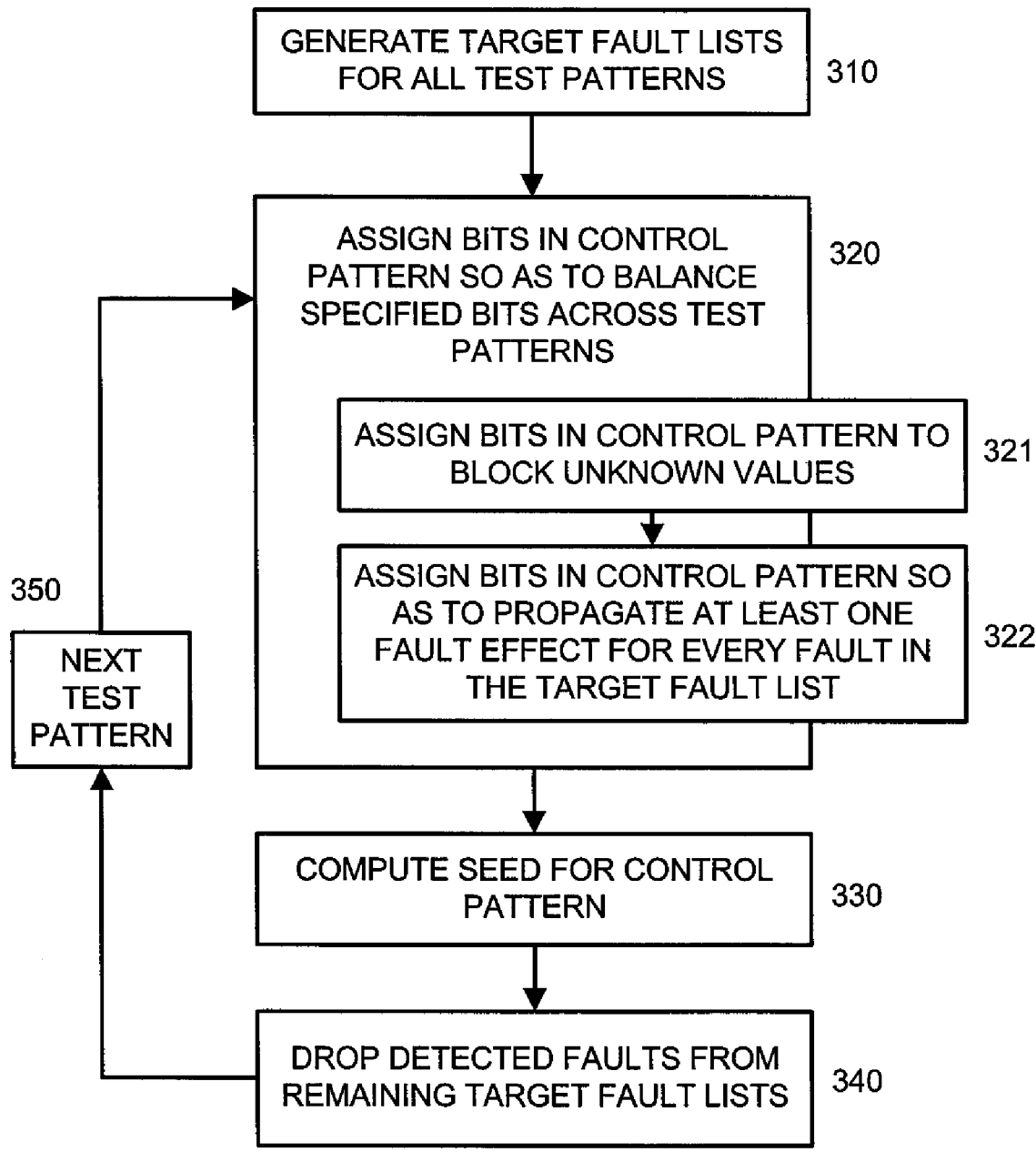
FIG. 3 is a flowchart of processing performed in generating control patterns for the blocking logic, in accordance with an embodiment of the invention.
Figure 4:
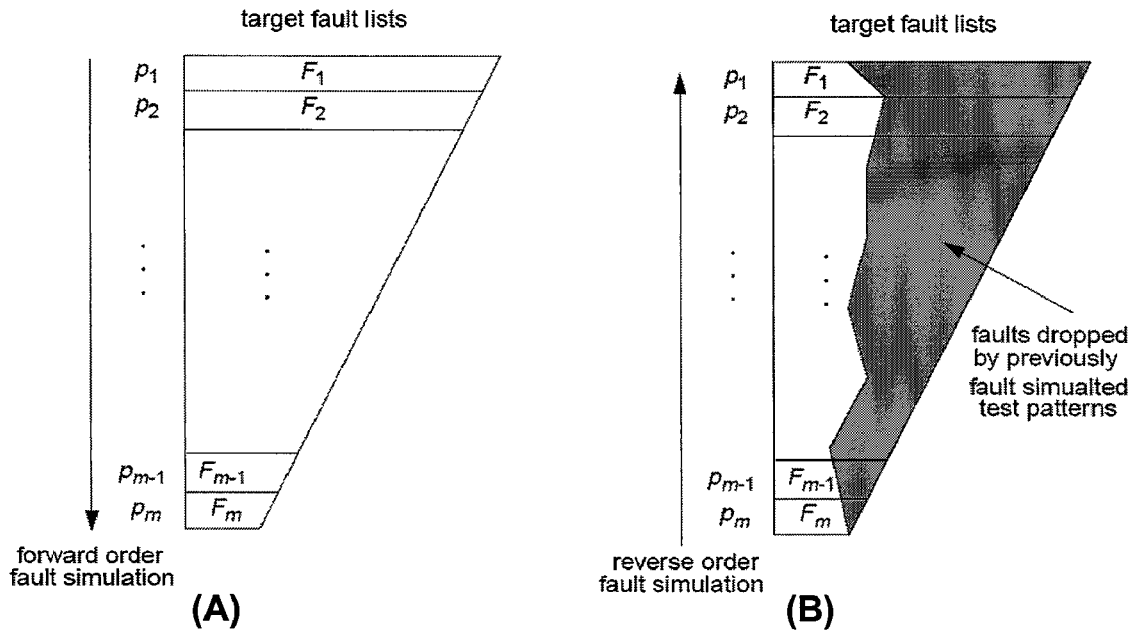
FIGS. 4 and 5 illustrate how control patterns are handled during the processing performed in FIG. 3.

FIG. 3 is a flowchart of processing performed in generating control patterns for the blocking logic, in accordance with an embodiment of the invention. At step 310, fault lists are generated for each of a given set of test pattern $p_1, p_2, \ldots, p_m$, for example, by using fault simulation. It is advantageous to generate the fault lists in the following manner. Let F be the fault set of the circuit. Test pattern $p_1$ is simulated first through test pattern $p_m$ which is simulated last, and faults detected by each test pattern are dropped from the fault list. In general, the first few test patterns, say $p_1, p_2, p_3$, detect larger numbers of faults and then fewer faults are detected by each test pattern as fault simulation proceeds. The last few test patterns detect very few faults. The last test pattern $p_m$ will have a fault list with only single detection faults. The faults detected by each test pattern during forward order fault simulation will compose the shape shown in FIG. 4. Let $F_i$ be a set of faults that are detected by test pattern $p_i$ during fault simulation. Fault set $F_i$ is referred to herein as the target fault list of test pattern $p_i$.

Steps 320-340 are repeated for each test pattern $p_i$ in the set of test patterns.

At step 320, the control pattern $c_i$ for the blocking logic is generated by assigning bits to the control pattern so as to balance the specified bits across the test patterns. Different techniques for balancing the number of specified bits in each control pattern are described below.

At step 330, a seed is computed for the control pattern $c_i$. This can be accomplished using a linear solver, as described in further detail herein. The fully specified control pattern $cr_i$ can be computed that will be applied to control signals of the blocking logic during test application by running the control LFSR with the computed seed for control pattern $c_i$ as the initial state for l cycles, where l is the scan chain length of the scan design (the number of scan flip-flops in the longest scan chain).

At step 340, detected faults are preferably dropped from the remaining fault lists. The fully specified control pattern $cr_i$ can be applied to control signals so as to identify all faults $F_i'$ that can be detected by test pattern $p_i$ from the entire fault set F. $F_i'$ will include all faults in $F_i$ and some extra faults since fault effects captured in scan flip-flops whose control bits are not specified in $c_i$ but specified to 0's in $cr_i$ can be observed. Faults that belong to $F_i'$ can be dropped from F and from all remaining target fault lists $F_j$.

Then, at step 350, the next test pattern in the set of test patterns is processed.

In one embodiment, the balancing of the specified bits in the control patterns can be accomplished as follows. Once a target fault list $F_i$ for test pattern $p_i$ has been identified for each test pattern, steps 320-340 can be performed in a reverse order, from the last test pattern $p_m$ to the first test pattern $p_1$ and blocking logic control patterns computed for each test pattern. The control pattern $c_i$ is initialized to unspecified bits, e.g., $c_i \leftarrow <X, X, \ldots, X>$. At step 321, bits are assigned to the control pattern $c_i$ to block unknown values. This can be accomplished by fault simulating the design with test pattern $p_i$ for the entire fault set F and identifying the scan flip-flops that capture unknowns. At step 322, bits are assigned to control pattern $c_i$ to propagate at least one fault effect for every fault in the target fault list $F_i$ for test pattern $p_i$. If we detect all faults in $F_i$ for every test pattern $p_i$, we can achieve the same fault coverage that can be achieved by direct scan chain observation. An advantageous technique for assigning the bits in the control pattern is as follows. A scan flip-flop can be found which captures fault effects for the maximum number of faults in $F_i$. If there are more than one scan flip-flop that captures fault effects for the same maximum number of faults in $F_i$, then select the scan flip-flop that captures fault effects for the maximum number of faults in F (the entire fault list). Assign a 0 (assuming OR logic used in the blocking logic) to the selected scan flip-flop's corresponding bit in control pattern $c_i$ (the value captured in the selected scan flip-flop will be propagated to the MISR). Repeat this until at least one fault effect for every fault in $F_i$ is selected to propagate to the MISR.

As the reverse order processing proceeds toward test pattern $p_i$, more faults will be dropped from fault lists for which test patterns have not yet been processed. Since faults in target fault lists for test patterns which are processed later (in the reverse order) will have more chances to be dropped by previously simulated test patterns, more faults will be dropped from the target fault lists for those test patterns. Note that fault lists that are processed later have more faults in their original target fault lists where no faults are dropped by the reverse order fault simulation. See FIG. 4. In consequence, the number of faults detected by test patterns will be balanced and numbers of specified bits in control patterns will also be balanced. In general, it is better to drop more faults by each test pattern to reduce numbers of specified bits in every control pattern. That is the reason why it is advantageous to select the scan flip-flop that captures errors for the maximum number of faults in F when there are more than one scan flip-flop that captures errors for the maximum number of faults in $F_i$ above.

Figure 5:
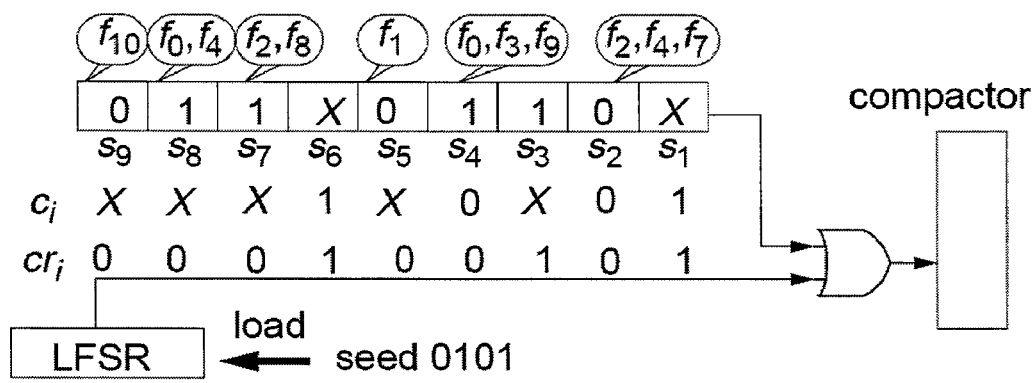

FIG. 5 illustrates the above technique. FIG. 5 shows a scan design with 9 scan flip-flops and fault effects captured in each scan flip-flop by test pattern $p_i$. Assume that the target fault list $F_i$ for test pattern $p_i$ contains faults $f_0$, $f_2$, $f_4$, and $f_7$. Since scan flip-flops $s_1$ and $s_6$ capture unknowns (X's), the bits of $c_i$ that correspond to $s_1$ and $s_6$ are assigned 1's to block the unknowns. Next, control bits are selected to be specified to 0's to propagate fault effects to the temporal compactor. Since scan flip-flop $s_2$ captures faults effects for the largest number (3) of faults in $F_i$, the fault effects captured in $s_2$ are first selected to enter the temporal compactor. The bit for $s_2$ is assigned a 0 in $c_i$. This guarantees detection of faults $f_2$, $f_4$, and $f_7$. Now if a fault effect for $f_0$ is selected, all faults in $F_i$ can be detected. Both $s_4$ and $s_8$ capture $f_0$. However, since $s_4$ captures fault effects for the larger number of faults in the entire fault list F, the fault effects captured in $s_4$ are selected to enter the temporal compactor and the bit for $s_4$ is assigned a 0 in $c_i$. This makes faults $f_3$ and $f_9$ that are not in $F_i$ but captured in $s_4$ also be detected. In consequence, $c_i = <1, 0, X, 0, X, 1, X, X, X>$ is selected as the control pattern for test pattern $p_i$. Assume that 0101 is computed by the linear solver as a seed for $c_i = <1, 0, X, 0, X, 1, X, X, X>$. The LFSR can be loaded with seed 0101 (750) and be clocked for 9 (the scan chain length of this scan design is 9) clock cycles to compute the sequence of control bits $cr_i = <1, 0, 1, 0, 0, 1, 0, 0, 0>$ that will be applied to the blocking logic. Since bits for scan flip-flops $s_5$, $s_7$, $s_8$, $s_9$ are assigned 0's in $cr_i$ in addition to the bits for $s_2$ and $s_4$ that are assigned 0's in $c_i$, extra faults $f_10$, $f_8$, and $f_1$ can be detected by test pattern $p_i$.

In another embodiment, the balancing of the number of specified bits in the control patterns is accomplished in a manner that takes account of the size of the LFSR. As mentioned above, the number of stages of the control LFSR is determined by the number of specified bits in the control pattern that has the largest number of specified bits. Since a single detection fault of a test pattern can be detected only by that test pattern, in order not to lose fault converge due to blocking some captured fault effects from entering the MISR, the control pattern for each test pattern should be specified such that at least one fault effect of every single detection fault of the test pattern propagates to the MISR. Accordingly, herein the number of stages of the control LFSR is specified by:

$$\max_{p_i \in P} \{UN_i + OB_i\} + M \quad (1)$$

where P is the set of test patterns, $UN_i$ is the number of unknowns in the response to test pattern $p_i$, $OB_i$ is the minimum number of scan flip-flops required to be observed to detect all single detection faults in target fault list $F_i$, and M is a margin added to ensure that the linear equations to compute a seed are solvable (see below). Note that since the fault effects of more than one fault can be captured into the same scan flip-flop, $OB_i$ may be smaller than the number of single detection faults in $F_i$. For the sake of convenience, $S_i$ is introduced to represent $UN_i + OB_i$ of test pattern $p_i$. The feedback polynomial of the control LFSR is randomly generated. Hence the generated feedback polynomial may not be primitive. However, since the control LFSR generates only one control pattern from each seed, it is not necessary to use a primitive polynomial.

Figure 7:
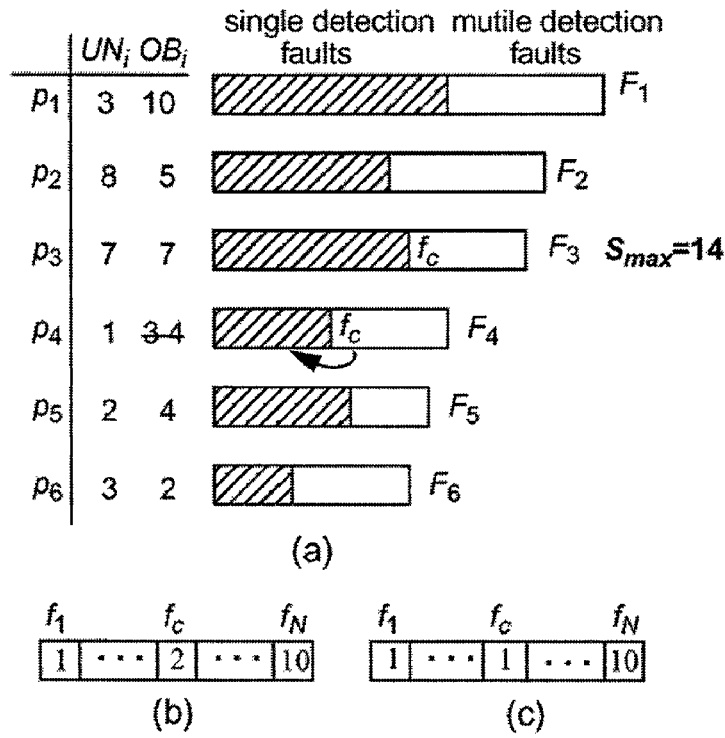
FIGS. 7 and 8 illustrate how control patterns are handled during the processing performed in FIG. 7.

As described above, fault simulation can be conducted to form target fault lists $F_i$ for each test pattern $p_i$ that are detected by test pattern $p_i$ when scan chains are directly observed without any compression scheme between the outputs of scan chains and the MISR. The number of unknowns $UN_i$ in response to each test pattern $p_i$ can be counted and stored. After n-detection fault simulation, a detection count $dc_j$, which represents the number of test patterns that detect fault $f_j$, can be assigned to each fault $f_j$, where $j=1, 2, \ldots, N$, where N is the total number of faults in the fault list. Faults in each target fault list are divided into two groups: single detection fault group and multiple detection fault group. $OB_i$ can be computed for each test pattern, $p_i$, where $i=1, 2, \ldots, m$. Let $p_{max}$ denote the test pattern that has largest $S_i$ among all test patterns $p_i$ in test set P. For example, FIG. 7 illustrates 6 example test patterns. The highlighted portion of each target fault list, $F_1, F_2, \ldots, F_m$, depicts the single detection fault group and blank portion the multiple detection fault group. Since $p_3$ has 7 unknowns ($UN_3=7$) in its response and requires to observe at least 7 scan flip-flops to detect all single detection faults ($OB_3=7$), $p_3$ is $p_{max}$ and $S_{max}$ is 14. The number of stages of the control LFSR for the set of test patterns is set to 14 (we assume M=0).

Figure 6:
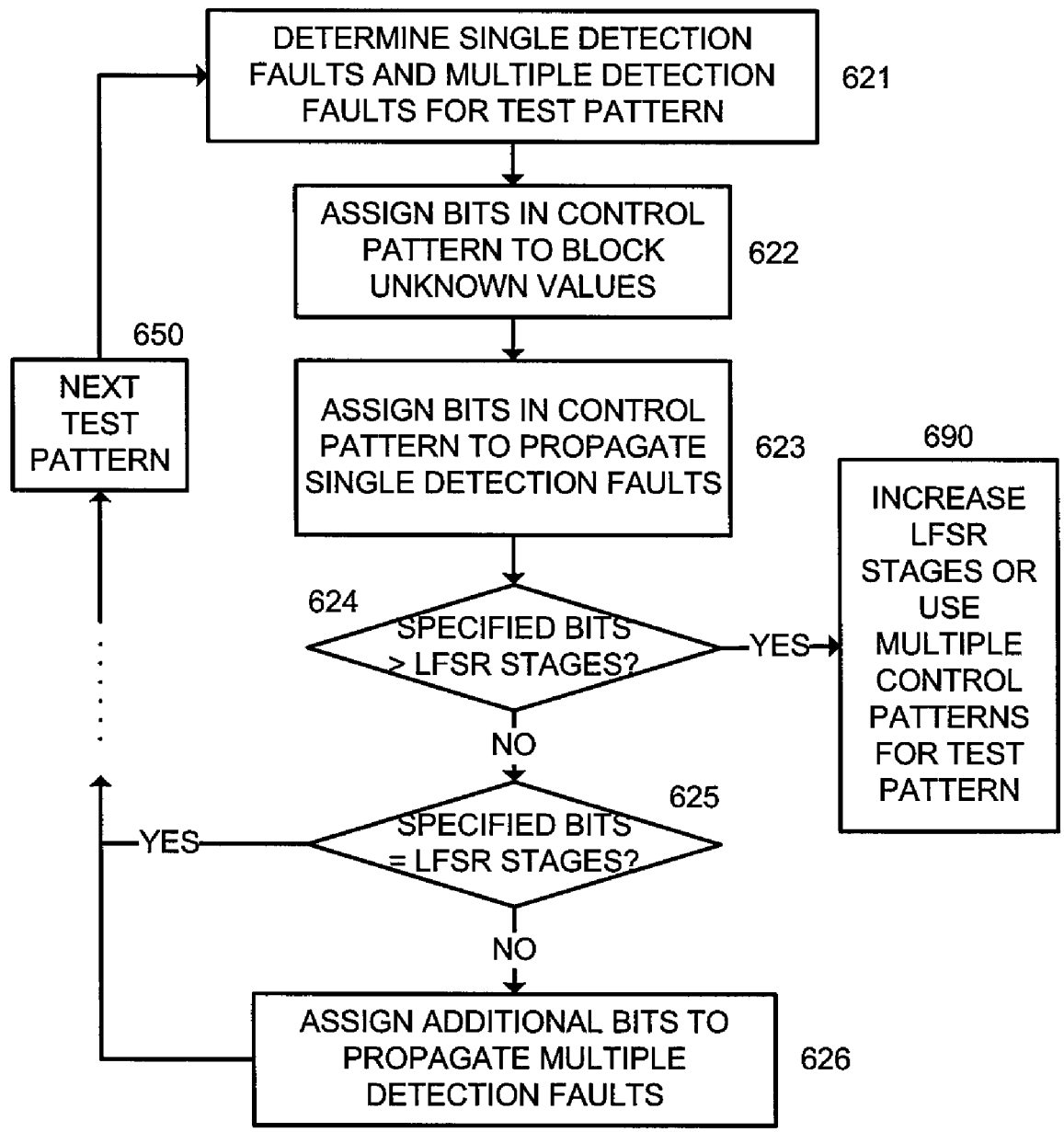
FIG. 6 is a flowchart of processing performed in generating control patterns for the blocking logic, in accordance with another embodiment of the invention.

FIG. 6 is a flowchart of processing performed in generating the control patterns in accordance with this embodiment. The order of the processing of the test patterns can be arbitrary, although it is preferable that the test patterns be processed starting from the test pattern $p_{max}$ as follows. Once we determine the number of stages and feedback polynomial of the control LFSR, we compute a control pattern for each test pattern, starting from the test pattern $p_{max}$. Upon completion of computing the control pattern for $p_{max}$, $p_{max}$ is removed from test set P. Then again the test pattern $p_n$ that has the largest $UN_n+OB_n$ among the remaining test patterns in the set is selected and a control pattern for $p_n$ is determined. This is repeated until test set P becomes empty (control patterns for all test patterns are computed). In the example test set shown in FIG. 7, since $p_3$ has the largest $S_i$ among all 6 test patterns, the control pattern for $p_3$ is determined first and the control pattern for $p_1$ is determined next.

A control pattern for a test pattern $p_i$ is determined as follows. First, at step 622, we assign 1's (we assume that the blocking logic is implemented only with OR gates) to the control bits corresponding to all scan flip-flops that capture unknowns to keep unknowns from entering the MISR. Then, at step 623, we select the minimum number of scan flip-flops that capture at least one fault effect of every single detection fault of $p_i$ and assign 0's to the control bits corresponding to the selected scan flip-flops. Therefore, the total number of specified bits in the control pattern for test pattern $p_i$ is given by $UN_i+OB_i$. A seed for the LFSR can be computed for the computed control pattern $c_i$ by using the linear solver described herein. The problem of finding the minimum number of scan flip-flops that should be observed to detect all single detection faults is equivalent to the vertex-covering problem, which is a well known NP-complete problem. For example, the following greedy heuristic can be used to solve the problem. We first select a scan flip-flop that captures fault effects of the largest number of single detection faults. If there are more than one scan flip-flop that captures fault effects of the same largest number of single detection faults, then we select the scan flip-flop that capture fault effects of the largest number of double detection faults among them. If there is more than one scan flip-flop that captures fault effects of the same number of single and double detection faults, then we select the scan flip-flop that captures fault effects of the largest number of new faults (faults that are not covered by scan flip-flops already selected for observation) in the target fault list of the test pattern. We repeat this until at least one fault effect of every single detection fault of the test pattern is selected to be observed.

Let $cr_i$ be the sequence of bits that will be generated by the control LFSR from the loaded seed, which is computed from $c_i$ by the proposed linear solver. The LFSR control pattern $cr_i$ for control pattern $c_i$ is calculated by simulating the control LFSR with the computed seed for l cycles, where l is the the number of scan flip-flops in the longest scan chain. Note that while $c_i$ has large number of X's, $cr_i$ is always fully specified, i.e., no X's exist in $cr_i$. Signal probabilities of all outputs of an LFSR are 0.5, i.e., if a long sequence of patterns is generated by an LFSR, then an output of the LFSR is assigned a 1 in approximately 50% of cycles and a 0 also in approximately 50% of cycles. We have observed that sequences generated from the seeds for control patterns computed by the proposed method also show similar behavior. Hence, even if we specify only very few bits of $c_i$ to 0's (this is typical because only minimum number of scan flip-flops that should be observed to detect all single detection faults are specified to 0's in $c_i$), approximately 50% of the bits of $cr_i$ are assigned 0's and hence about 50% of scan flip-flops are observed. In consequence, a lot more fault effects than those selected by assigning 0's in $c_i$ propagate to the MISR (many multiple detection faults that are not specifically targeted by control pattern $c_i$ can be observed). All observed faults are dropped not only from the target fault list of $p_i$ but also from target fault lists of all other test patterns in the set P. Hence as control patterns for more test patterns are determined, more faults will be dropped from the remaining fault lists.

As described above, we specify control bits to observe only single detection faults of each test pattern. Hence even if about 50% scan flip-flops are always observed, some multiple detection faults may not be observed. Especially if a double detection fault (fault that is detected by only two test patterns in the set) of a test pattern is not observed, then it becomes a single detection fault. For example, fault $f_c$ shown in FIG. 7 is a double detection fault (the detection count of $f_c$ is 2 in FIG. 7(B). If no fault effects of $f_c$ are selected to propagate to the MISR in $c_3$ for $p_3$ and even the fully specified LFSR pattern $cr_3$ does not propagate any fault effect of $f_c$, then $f_c$ becomes a single detection fault and moves from the multiple detection fault group to the single detection fault group in $F_4$. Accordingly, detection count $dc_c$ for fault $f_c$ decrements by one after the control pattern for test pattern $p_3$ is processed (see FIG. 7(C). To address this, single detection fault groups of target fault lists and detection counts of faults are updated after a control pattern for each test pattern is determined.

Figure 8:
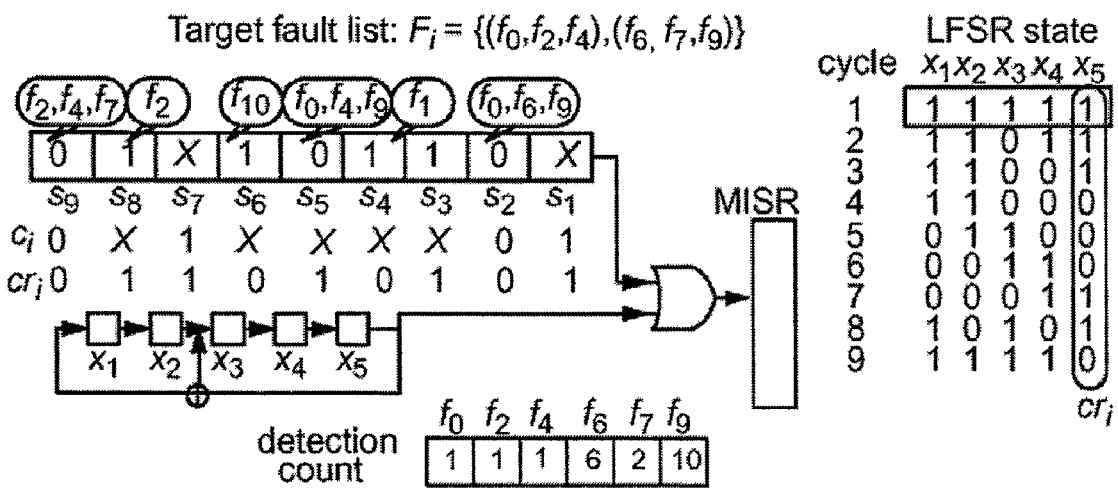

FIG. 8 shows an example. FIG. 8 shows a scan design with 9 scan flip-flops and fault effects captured in the scan flip-flops by test pattern $p_i$. Assume that the target fault list $F_i$ for test pattern $p_i$ contains faults $f_0, f_2, f_4, f_6, f_7,$ and $f_9$. Faults $f_0, f_2$ and $f_4$ are single detection faults and $f_6, f_7$ and $f_9$ are multiple detection faults. Note that $f_7$ is a double detection fault (the detection count of $f_7$ is 2 in the detection count table shown in FIG. 8). Since scan flip-flops $s_1$ and $s_7$ capture unknowns, the corresponding bits of $c_i$ are assigned 1's to block the unknowns. Next we select control bits to be specified to 0's to observe single detection faults. Since scan flip-flop $s_2$ captures fault effects of single detection faults $f_0$ and $f_4$ and $s_9$ captures fault effects of $f_2$ and $f_4$, $s_2$ and $s_9$ capture faults effects of the same largest number (2) of single detection faults. Note that if there are more than one scan flip-flop that capture faults effects of the same largest number of single detection faults, then we select the scan flip-flop that capture fault effects of the largest number of double detection faults. Hence scan flip-flop $s_9$ is selected first because $s_9$ captures a fault effect for one double detection fault $f_7$ while $s_2$ captures none. Observing $s_9$ guarantees detection of faults $f_2, f_4,$ and $f_7$. Now if a fault effect of another single detection fault $f_0$ is selected, then all single detection faults in $F_i$ can be detected. Both $s_2$ and $s_5$ capture fault effects of $f_0$. However, since $s_5$ captures the fault effects of more new faults in $F_i$ than $s_2$ (while $s_5$ additionally detects $f_6$ and $f_9$, $s_2$ detects only $f_9$), $s_5$ is selected for observation and the control bit for $s_5$ is assigned a 0 in $c_i$. In consequence, $c_i=<0, X, 1, X, 0, X, X, X, 1>$ is selected as the control pattern for test pattern $p_i$. An LFSR with feedback polynomial $1+x^2+x^5$ is used to generate control signals for the blocking logic. Assume that 11111 is computed by the linear solver as a seed for $c_i$ (explained in detail in Section??). We load the LFSR with seed 11111 and clock it for 9 (the scan chain has 9 flip-flops) clock cycles to compute the LFSR sequence $cr_i$=<0, 1, 1, 0, 0, 0, 1, 1, 1>, which will be applied to the blocking logic. Since bits for scan flip-flops $s_4$, and $s_6$ are assigned 0's in $cr_i$ in addition to the bits for $s_5$ and $s_9$ that are assigned 0's in $c_i$, extra faults $f_1$ and $f_{10}$, which are not in $F_i$, are also detected.

Since numbers of single detection faults of test patterns change after the control pattern for a test pattern is computed, the minimum number of scan flip-flops that should be observed to detect all single detection faults, i.e., $OB_i$ and hence $S_i$, should be updated for all test patterns $p_i$ remaining in the set whose at least one double detection fault becomes a single detection fault. Updating $S_i$ for a test pattern $p_i$ requires identifying scan flip-flops that capture fault effects of new single detection faults. This requires storing locations of scan flip-flops that capture fault effects of every fault detected by each test pattern or conducting fault simulation with all test patterns that get more single detection faults during the process of computing control patterns. Since this costs huge memory space or prohibitive time complexity for large designs, it is preferable to approximate the increase in $S_i$ (the minimum number of additional scan flop-flops that should be observed to detect new single detection faults) of test pattern $p_i$ by the number of new single detection faults $p_i$ gets. In other words, we assume that no fault effects of new single detection faults are captured into a scan flip-flop that captures a fault effect of another (new or old) single detection fault.

Assume that $S_i$ (or $UN_i+OB_i$) of a test pattern $p_i$ is very large so that it is close to $S_{max}$. Then even if a small number of its multiple detection faults become single detection faults, $S_i$ of the test pattern may exceed the number of stages of LFSR. In order to find a seed for control pattern $c_i$ by a linear solver, the number of specified bits in $c_i$, i.e., $S_i=UN_i+OB_i$ should be smaller than or equal to the number of stages of LFSR. In contrast, if test pattern $p_i$ has small $S_i$, then even if some of its multiple detection faults become single detection faults, $S_i$ will be still smaller than the number of stages of LFSR. This is the reason why it is advantageous to choose the test pattern $p_i$ that has largest $S_i$ in the test set first when computing control patterns.

In most test patterns, all single detection faults can be observed by specifying fewer control bits than $S_{max}$. If this is the case for a test pattern, then, at step 626 in FIG. 6, we can continuously specify additional control bits to observe fault effects of multiple detection faults of the test pattern until fault effects of all multiple detection faults are selected for observation or the number of specified bits in the control pattern becomes $S_{max}$. This minimizes the chance that the number of control bits to be specified to detect all single detection faults of some test patterns exceeds $S_{max}$ due to increase in the number of single detection faults. However, even though we minimize its possibility, it is still possible that the number of specified bits to detect all single detection faults exceeds $S_{max}$ in some control patterns. If the number of specified bits $S_i$ of test pattern $p_i$ is greater than $S_{max}$, then, at step 690, we have to increase the number of stages of the control LFSR and recompute control patterns for all test patterns; we change $S_{max}$ to (old $S_{max}+S_i$)/2, the number of stages of LFSR to new $S_{max}+M$, and move all test patterns for which control patterns are already determined back to the set P. Then we restart computing control patterns from scratch. Since the cost of restarting the whole process from scratch is very expensive in large designs, we should use enough margin M for the number of stages of LFSR. Note that since we always choose the test pattern $p_n$ that has the largest $S_n$ among all test patterns to compute its control pattern, if any, we can find a test pattern that requires more than $S_{max}+M$ specified bits to detect all its single detection faults and restart early. This can reduce time wasted due to restarting of the process.

A preferred embodiment of the above technique can be summarized as follows:

1. Conduct n-detection fault simulation with the set of test patterns P that will be applied to the circuit during test application. For each test pattern $p_i$, count the number of unknowns $UN_i$ and the minimum number of scan flip-flops $OB_i$ that should be observed to detect all single detection faults of $p_i$.
2. Find the test pattern $p_{max}$ that has the largest $S_{max}=(UN+OB)_{max}$ among all test patterns in the set to determine the number of stages of control LFSR.
3. Set the number of stages of LFSR to $S_{max}+M$ and generate a random feedback polynomial for the LFSR with $S_{max}+M$ stages.
4. If no test pattern exits in the set, then exit. Select the test pattern $p_k$ that has largest $UN_k+OB_k$ among all test patterns remaining in the set. $c_k \leftarrow$ <X, X, . . . , X>.
5. Identify scan flip-flops that capture unknowns and assign 1's to their corresponding control bits to block unknowns.
6. Find a flip-flop that captures fault effects of the maximum number of single detection faults in $F_k$. If there are more than one scan flip-flop that capture fault effects of the same maximum number of single detection faults in $F_k$, then select the scan flip-flop that captures fault effects of the maximum number of double detection faults in $F_k$. Assign a 0 to the corresponding bit of $c_i$. Repeat this step until at least one fault effect of every single detection fault in $F_k$ is selected to propagate to the MISR.
7. If the number of specified bits in $c_k$ is smaller than $S_{max}$, then continue specifying additional control bits to 0's to observe multiple detection faults until the number of specified bits becomes $S_{max}$ or all multiple detection faults in $F_k$ are observed.
8. Compute a seed for the control pattern $c_k$ by using the linear solver. If $c_k$ is not solvable due to too many specified bits in $c_k$, then set $S_{max} \leftarrow (UN_k+OB_k+S_{max})/2$, move all the test patterns that are removed from test set P back to P, and go to Step 3 to restart computing control patterns from scratch. Otherwise, compute the fully specified LFSR pattern $cr_k$ by running the LFSR with the computed seed for l cycles, where l is the the number of scan flip-flops in the longest scan chain.
9. Apply $cr_k$ to control signals and drop all faults that are detected by test pattern $p_k$ from $F_k$ and also from other target fault lists $F_j$. Remove $p_k$ from test set P. Update $OB_i$ for the remaining test patterns $p_i$ that get more single detection faults in the set. Go to Step 4.

Figure 9:
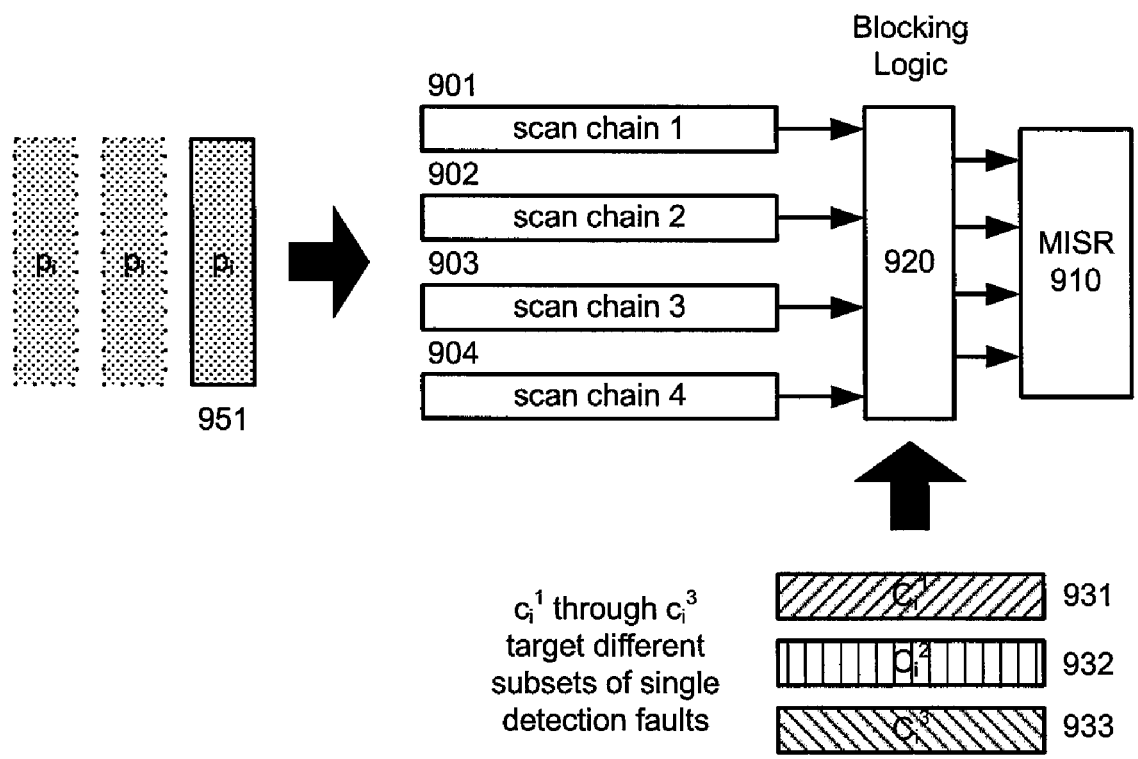
FIG. 9 illustrates how multiple control patterns can be used in order to provide fault coverage with a small-sized LFSR.

If there is any design change, whole test patterns should be regenerated. Then control patterns also should be regenerated and $S_{max}$ can increase in the regenerated control patterns. Often it is not possible to redesign the control LFSR due to a tight schedule. A solution to this problem is to apply test pattern $p_i$ whose $S_i$ exceeds the number of stages of the control LFSR multiple times. Although the same test pattern is repeatedly applied, a different control pattern that targets a different subset of single detection faults of $p_i$ is computed for each application of $p_i$. Since only a subset of single detect faults of $p_i$ is targeted by each control pattern, we can reduce the number of specified bits in control patterns not to exceed the number of stages of control LFSR. This is illustrated in FIG. 9. The control pattern $p_i$ 951 is repeated three times with three different control patterns $c_i^1$, $c_i^2$, and $c_i^3$, labelled 931, 932, 933. The number of specified bits in each of the control patterns has been selected to fit within the constraints imposed by the LFSR. The three control patterns 931, 932, 933 target different subsets of the single detection faults for $p_i$, and, together, can target all of the single detection faults for $p_i$.

SEED COMPUTATION. The seed with which the LFSR needs to be loaded to generate a required control pattern is determined in the following way. An equation, is formed for every scan cell in terms of the initial values of the LFSR by symbolically simulating the running of the LFSR. A set of equations, called required_eqns is formed for the specified bits, one equation for each specified bit in the control pattern. All the equations in the set need to be solved simultaneously to determine the seed. For example, Gaussian Elimination can be used to solve the set of equations. In Gaussian Elimination, the matrix is reduced to a simpler form using Gauss-Jordan reduction. After Gauss-Jordan reduction, a set of columns of the matrix forms an identity matrix; the variables corresponding to these columns are called pivot variables. Variables corresponding to all the other non zero columns are called free variables. The solution space of this system of equations can be written in terms of the free variables. If the number of free variables is $f_v$, then the number of solutions is given by $2^{f_v}$.

Although any of the solutions can be used as the initial state to be loaded into the LFSR to generate the desired control pattern, it is advantageous to choose a seed that maximizes the number of observed fault effects. This increases the probability to detect unmodeled faults.

In addition to required_eqns, which corresponds to the scan cells that capture unknowns and selected fault effects, another set of equations, called optional_eqns, is formed, corresponding to scan flip-flops that capture any fault effect but are not selected for observation in the control pattern. To observe all these scan flip-flops the control values for these flip-flops should be set to 0's. These new equations are then re-written in terms of only free variables by using the solution space. This way, all the solutions of required_eqns are captured in new_eqns. The next step is to assign values to the free variables that satisfy the maximum number of equations in new_eqns, i.e. find the solution to the original set of equations that will satisfy the maximum number of equations in the new set. A branch and bound algorithm can be used to assign values to the free variables. First, all the equations can be given to a linear solver to check if they are solvable. If no solution exists, an equation that has conflicts with other equations in the set can be removed. Conflicting equations can be pruned in this way from the new set of equations until all the remaining equations are solvable. A solution for this pruned set gives values to the free variable of the original set of equations. This assignment of values to free variables is in turn used to calculate the values for the pivot variables in the original set and hence a seed for the LFSR. Note that this technique, which maximizes the number of optional_eqns satisfied, can be generalized further. Each of the equations can be assigned a weight, based on the number of fault effects observed by the corresponding scan flip-flop or any other similar measure. Then the solution that satisfies the maximum weighted sum of the new equations is used as the seed of the LFSR.

$$s_1 = x_5 \quad \text{(a)}$$
$$s_2 = x_4$$
$$s_3 = x_3$$
$$s_4 = x_2 \oplus x_5$$
$$s_5 = x_1 \oplus x_4$$
$$s_6 = x_3 \oplus x_5$$
$$s_7 = x_2 \oplus x_4 \oplus x_5$$
$$s_8 = x_1 \oplus x_3 \oplus x_4$$
$$s_9 = x_2 \oplus x_3$$

$$\begin{matrix} s_{1'}^* \\ s_{5'}^* \\ s_{7'}^* \\ s_{9'}^* \end{matrix} \begin{bmatrix} 0 & 0 & 0 & 0 & 1 \\ 1 & 0 & 0 & 1 & 0 \\ 0 & 1 & 0 & 1 & 1 \\ 0 & 1 & 1 & 0 & 0 \end{bmatrix} \begin{pmatrix} x_1 \\ x_2 \\ x_3 \\ x_4 \\ x_5 \end{pmatrix} = \begin{bmatrix} 1 \\ 0 \\ 1 \\ 0 \end{bmatrix} \quad \text{(b)}$$

$$\begin{bmatrix} 1 & 0 & 0 & 1 & 0 \\ 0 & 1 & 0 & 1 & 0 \\ 0 & 0 & 1 & 1 & 0 \\ 0 & 0 & 0 & 0 & 1 \end{bmatrix} \begin{pmatrix} x_1 \\ x_2 \\ x_3 \\ x_4 \\ x_5 \end{pmatrix} = \begin{bmatrix} 0 \\ 0 \\ 0 \\ 1 \end{bmatrix} \quad \text{(c)}$$

$$\begin{pmatrix} x_1 \\ x_2 \\ x_3 \\ x_5 \end{pmatrix} = \begin{bmatrix} 0 \\ 0 \\ 0 \\ 1 \end{bmatrix} \oplus \begin{bmatrix} 1 \\ 1 \\ 1 \\ 0 \end{bmatrix} (x_4) \quad \text{(d)}$$

$$\begin{array}{ll} s_{2'}^* : x_4 = 0 & x_4 = 0 \\ s_{4'}^* : x_2 \oplus x_5 = 0 & x_4 = 1 \\ s_{6'}^* : x_3 \oplus x_5 = 0 & x_4 = 1 \\ s_{8'}^* : x_1 \oplus x_3 \oplus x_4 = 0 & x_4 = 0 \end{array} \quad \text{(e)}$$

The above equations can be used as an example. Equations (a) shows the relation of each scan cell to the LFSR initial variables for the example scan design of FIG. 5. The set of equations for the specified bits in the control pattern (required_eqns) is shown in (b), in a matrix format. The Gauss-Jordan reduced matrix is shown in (c). In the Gauss-Jordan reduced matrix, the columns corresponding to the variables $x_1$, $x_2$, $x_3$, $x_5$ form an identity matrix and hence these are the pivot variables while $x_4$ is a free variable. The solution space of this system of equations can be written as shown in (d). Since there is only one free variable, there are only two possible solutions. Since scan flip-flops $s_2$, $s_4$, $s_6$, and $s_8$ capture some fault effects and have not been selected earlier for observation, the optional_eqns correspond to these scan flip-flops. Equations (e) shows the optional_eqns as well as the simplified equations in terms of the free variable $x_4$ (referred to as new_eqns). Since there is only one free variable, the equations are straightforward and the conflicting equations can be noted by direct observation. Either the first and fourth equations or the second and third equations can be satisfied. For this example, if the pruned set is the first and fourth equations, then $x_4$ is assigned a 0 and the corresponding seed is (0, 0, 0, 0, 1). Otherwise, $X_4$ is assigned to 1 and the seed is (1, 1, 1, 1, 1). If the seed (0, 0, 0, 0, 1) is used instead in FIG. 5, then the control pattern generated by the LFSR will be $cr_i$=<0, 0, 1, 1, 0, 1, 0, 0, 1> and no extra fault is detected.

Figure 10:
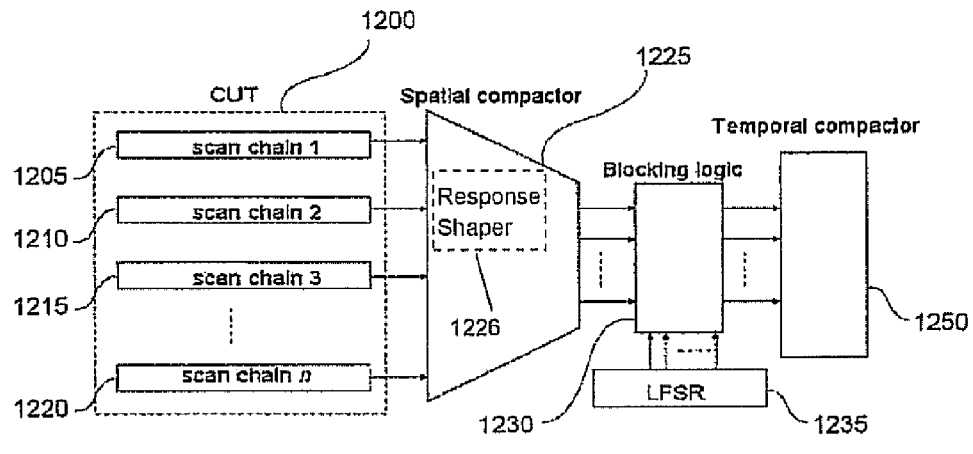
FIGS. 10A, 10B, and 10C illustrate other embodiments which includes a spatial compactor.
Figure 10:
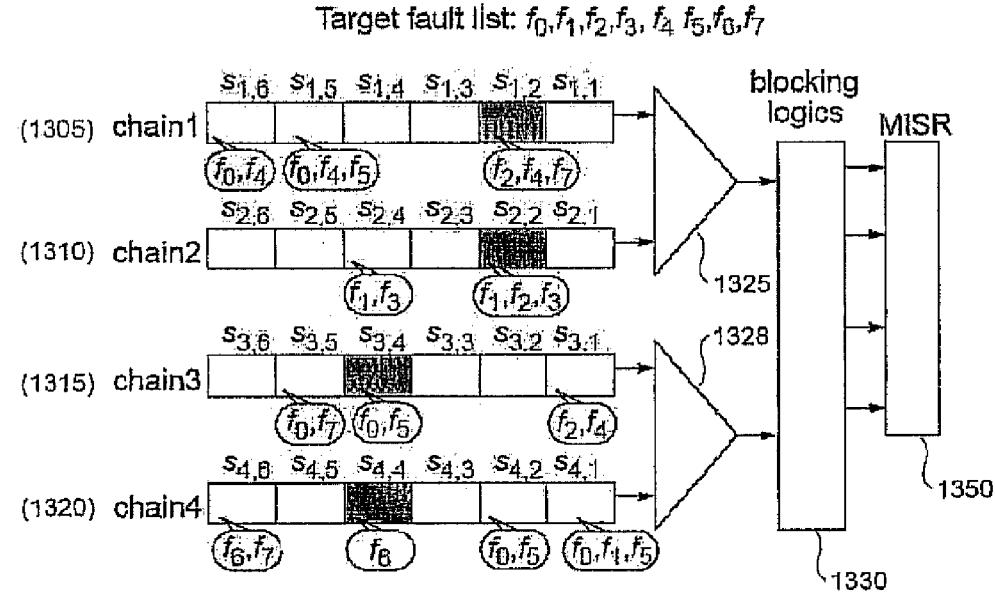
Figure 10:
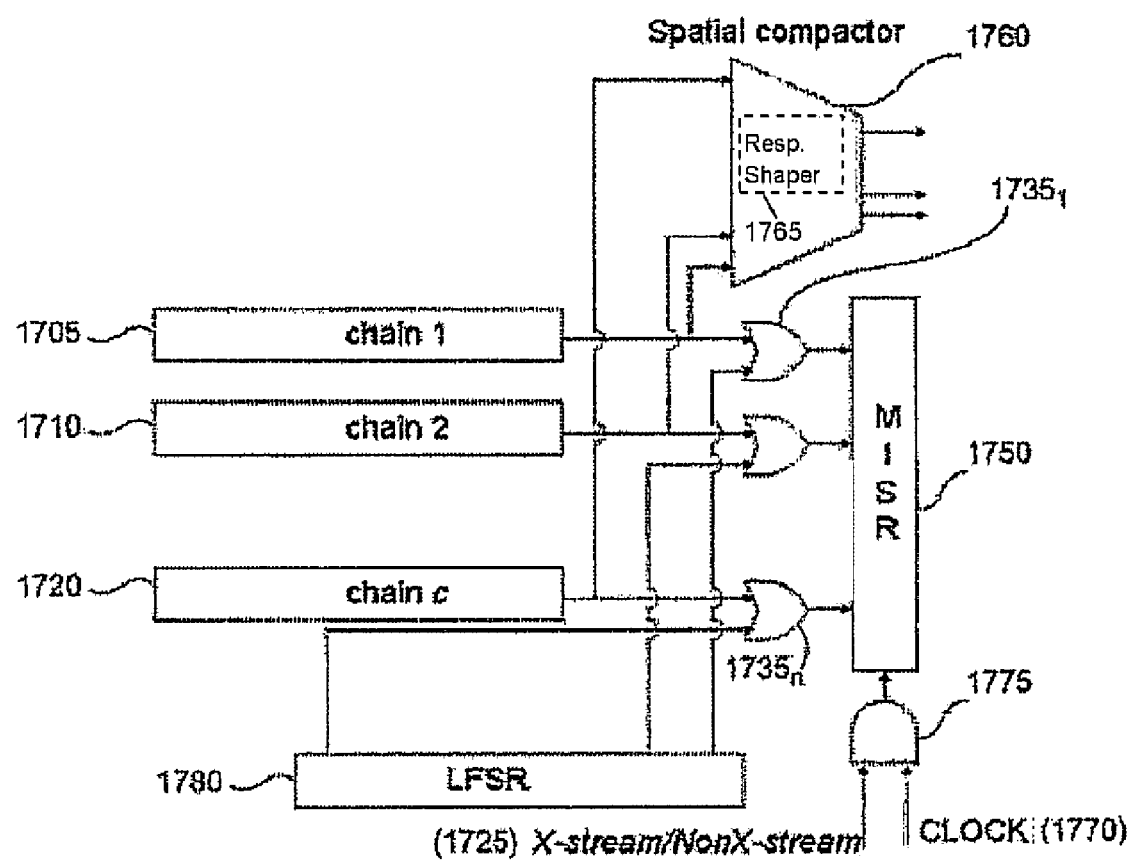

The number of specified bits in control patterns can be further reduced if spatial compactors are used to compress output responses in conjunction with the temporal compactor. FIG. 10 illustrates an example of this embodiment. The scan flip-flops and fault effects of FIG. 2 are redrawn in FIG. 10(B) with two spatial compactors, which are inserted between the outputs of scan chains and the blocking logic. Responses from the scan chains are first compacted by the two spatial compactors before they enter the MISR. As described above, if we need to observe fault effects captured in scan flip-flops $s_{1,2}$, $s_{2,2}$, $s_{3,4}$, and $s_{4,4}$ (assume that all the faults in the target fault list are single detection faults), we can detect all the 8 faults in the target fault list for the test pattern. Hence at least 4 control bits need to be specified to 0's in the original circuit shown in FIG. 2, which does not use any spatial compactor. Now consider the circuit shown in FIG. 10(B) that has spatial compactors. Note that the fault effects captured in the scan flip-flops $s_{1,2}$ and $s_{2,2}$ reach the same compactor output at the same cycle and the fault effects captured in another pair of scan flip-flops $s_{3,4}$ and $s_{4,4}$ also reach the same compactor output at the same shift cycle. Hence, we need to specify only two control bits to 0's to detect all the 8 faults if the two spatial compactors are used in conjunction with the MISR.

The presence of unknowns in spatial compaction is not as catastrophic as in temporal compaction, however it still decreases fault coverage. Even number of errors that are scanned out at the same shift cycle cannot be observed in spatial compaction. Even though there are certain types of spatial compactors that are tolerant to unknowns and even numbers of errors which can be used to minimize the decrease in fault coverage, using these compactors with a temporal compactor such as a MISR may increase the required control data volume for the following reason. Since a scan chain output is connected to multiple compactor outputs, one unknown at a scan chain output can propagate to multiple compactor outputs. Hence multiple control bits should be specified to 1's to block the single unknown that appears at the scan chain output. Accordingly, it can be advantageous to utilize a spatial compactor with a response shaper 1226, 1765, as disclosed in U.S. patent application Ser. No. 10/985,599, entitled "IMPROVED TEST OUTPUT COMPACTION USING RESPONSE SHAPER," filed on Nov. 10, 2004, which is incorporated by reference herein. The response shaper therein disclosed can reduce the decrease in fault coverage due to existence of even numbers of errors and unknowns by an entirely different methodology; if a fault effect is masked because it appears with an unknown or an odd number of fault effects of the same fault at a given scan shift cycle, it reshapes the response of a selected scan chain by delaying or advancing scan shift operations of the scan chain such that the fault effect is not masked by unknowns and other fault effects. Since it uses simple XOR tree-based output compactors, an unknown at a scan chain output can propagate only to one output of the compactor. In fact, if two or more unknowns appear at the same cycle, then we can block all of the unknowns by specifying only one control bit to reduce the number of control bits to be specified to 1's.

FIG. 10(c) illustrates another embodiment which integrates the spatial compactor with the temporal compactor in parallel. As depicted in FIG. 10(c), both the spatial compactor 1760 and the temporal compactor 1750 are connected to the scan chains 1705, 1710, . . . 1720. Selective logic 1775 can be used to effectively turn off the temporal compactor 1750, e.g., when a large series of unknown values are propagated with the test response data. While the temporal compactor 1750 is frozen, the ATE can observe the outputs of the spatial compactor 1760. The signature of the temporal compactor 1750 can be scanned out when the response to each pattern is scanned out or at the end of the test session. Since no control data for the blocking logic is required when the spatial compactor is being used, the size of the control data for the this scheme should be reduced. However, since it uses a spatial compactor, the arrangement has the same disadvantages of spatial compactors, i.e. some fault effects could be masked thereby possibly providing lower fault coverage.

The proposed blocking schemes have been discussed above in the context of an external ATE-based testing environment, where test patterns and seeds for the control LFSR are stored in an external ATE and transferred to the circuit under test from the ATE during test application. It should be noted that the proposed blocking scheme has application in a built-in self-test (BIST) environment as well.

Figure 11:
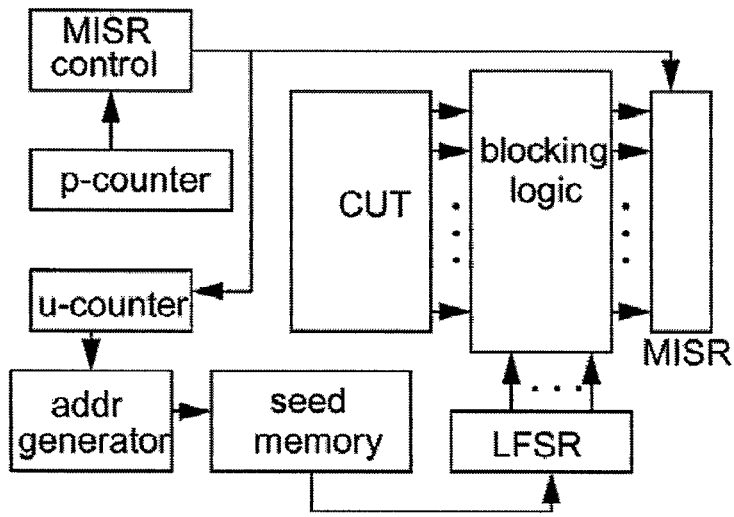
FIGS. 11A and 11B illustrates another embodiment for built-in self-test (BIST).

In BIST, seeds for all control patterns should be stored in a memory and loaded into the LFSR when needed. Hence it is even more important to minimize storage amount for seeds in BIST environment to minimize overall hardware overhead. FIG. 11(A) shows an exemplary implementation of BIST that has a blocking logic controlled by an LFSR. Herein, storage bits for seeds are minimized by reusing a same seed to generate LFSR patterns for multiple control patterns. Compatibility relationship between a control pattern and an LFSR pattern is defined as follows. If there is any scan input $s_i$, i=1, 2, . . . , z, where z is the number of scan inputs in the circuit, that is assigned a 1 (0) in LFSR pattern $cr_j$, which is generated by the control LFSR from loaded seed $seed_j$, but assigned a 0 (1) in control pattern $c_i$, then LFSR pattern $cr_j$ and control pattern $c_i$ are said to be incompatible. Otherwise $cr_j$ and $c_i$ are said to be compatible. If $cr_j$ is compatible with $c_i$, then the LFSR pattern $cr_i$ for $c_i$ can be generated from the same seed that generates $cr_j$. For example, in FIG. 11(B), $c_{j+1}$ is incompatible with $cr_i$ since $s_9$ is assigned a 1 in $c_{j+1}$ but assigned a 0 in $cr_i$. $c_{j+1}$ is however compatible with $cr_k$.

The following technique can be used to minimize seed storage bits. First, we fault simulate the circuit with the entire set of test patterns that will be generated by the random pattern TPG during BIST. Typically, large number of test patterns that are generated by a random pattern TPG do not detect any new fault. Test patterns that do not detect any new fault are identified and screened out during fault simulation. While responses to these patterns are scanned out, the MISR is disabled by the MISR control (see FIG. 11(A)) so that responses to these test patterns do not enter the MISR. Note that since the blocking logic is not used while responses to these patterns are scanned out, seeds for these patterns need not be stored. All useless random test patterns, which do not detect any new fault, are removed from the set of test patterns that will be considered for computation of their control patterns.

As mentioned above, storage bits for seeds can be minimized by reusing one seed to generate LFSR patterns for multiple control patterns. The set of minimal seeds to be stored is dynamically formed by continuously adding seeds into the set. First the control LFSR is designed based on $UN_{max}+SD_{max}$ of the test pattern $p_{max}$, which requires the largest number of specified bits in its control pattern. Control patterns for the BIST patterns that remain after useless random patterns are removed from the set are computed as the deterministic test patterns are computed. A control pattern $c_a$ is computed for the test pattern $p_a$ that has the largest $S_a$ among the test patterns in the set. If there exists an LFSR pattern in the current set of seeds that is compatible with $c_a$, then no seed is computed for $c_a$. Otherwise, seed $seed_a$ and the corresponding LFSR pattern $cr_a$ are computed and added into the current seed set. This is repeated for all test patterns that are in the set, which detect at least one new fault. For example, in FIG. 11(B), since control pattern $c_j$ is compatible with LFSR pattern $cr_i$, which exists in the current seed set, no seed for $c_j$ is added. During BIST, the LFSR pattern for control pattern $c_j$ will be generated from seed 0101, which generates $cr_i$. Likewise, since $c_{j+1}$ is compatible with $cr_k$, no seed for $c_{j+1}$ is added to the seed set. On the other hand, no LFSR patterns that exist in the current seed set are compatible with $c_{j+2}$. Hence a new seed 0110 and the corresponding LFSR pattern $cr_{k+1}$ are added into the current seed set for $c_{j+2}$.

While exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow and their structural and functional equivalents.

What is claimed is:

1. A method of configuring a test output compaction arrangement, the arrangement receiving test response data from a circuit after a test pattern is applied to the circuit, the arrangement comprising blocking logic interposed between the circuit and a temporal compactor, the blocking logic responsive to control signals from a control signal generator so as to selectively block test response data from propagating to the temporal compactor, the method comprising:
   identifying unknown values and fault effects in the test response data which would propagate to the temporal compactor when a test pattern in a set of test patterns is applied to the circuit;
   assigning specified bits in a control pattern associated with the test pattern to block the unknown values from entering the temporal compactor and to propagate selected fault effects to the temporal compactor, the fault effects selected so as to balance the number of specified bits across the set of test patterns, the control patterns with the assigned specified bits used to compute the control signals to be generated by the control signal generator for the blocking logic.

2. The method of claim 1 wherein the fault effects are identified by generating a target fault list for each test pattern in a forward order and wherein the specified bits are assigned to propagate only a single fault effect for every fault in the fault list of each test pattern in a reverse order, the target fault lists generated so as to drop faults identified in previous target fault lists.

3. The method of claim 1 wherein the specified bits are assigned so as to propagate fault effects caused by single detection faults.

4. The method of claim 3 wherein the specified bits are assigned so as to propagate only one fault effect for every single detection fault associated with the test pattern.

5. The method of claim 3 wherein, after assigning specified bits in the control pattern to propagate fault effects for all single detection faults for the test pattern, additional bits are specified up to a maximum number of specified bits in the control pattern so as to propagate fault effects caused by multiple detection faults to the temporal compactor.

6. The method of claim 2 wherein the number of specified bits in the control pattern is further reduced by assigning a first set of specified bits to a first control pattern so as to propagate a first set of fault effects caused by a first subset of all single detection faults, assigning a second set of specified bits to a second control pattern so as to propagate a second set of fault effects caused by a second subset of all single detection faults for the test pattern, where the test pattern can be applied with the first control pattern and with the second control pattern.

7. The method of claim 1 wherein the control signal generator uses reseeding to generate the control signals and wherein the control patterns with the assigned specified bits are used to compute seeds for the control generator.

8. The method of claim 1 wherein the control signal generator is a linear feedback shift register.

9. The method of claim 1 wherein the control signal generator is a cellular automaton.

10. The method of claim 1 wherein the control signal generator comprises one or more memories storing control signals.

11. The method of claim 1 wherein the temporal compactor is a multiple input signature register.

12. The method of claim 1 wherein the test output compaction arrangement is integrated with the circuit for built-in self-test (BIST).

13. A method of configuring a test output compaction arrangement, the arrangement receiving test response data from a circuit after a test pattern is applied to the circuit, the arrangement comprising blocking logic interposed between the circuit and a temporal compactor, the blocking logic responsive to control signals from a control signal generator so as to selectively block test response data from propagating to the temporal compactor, the method comprising:
   determining whether a first control pattern used for seed computation for first control signals to block unknown values appearing in test response data, when a first test pattern is applied to the circuit, is compatible with a second control pattern used for seed computation for second control signals to block unknown values appearing in test response data, when a second test pattern is applied to the circuit, and
   if the first control pattern and the second control pattern are compatible, reusing a seed at the control signal generator to generate both the first and second control signals for the blocking logic.

14. The method of claim 13 wherein seeds for the control signal generator are stored in memory.

15. The method of claim 13 wherein the test output compaction arrangement is integrated with the circuit for built-in self-test (BIST).

* * * * *